United States Patent
Watanabe

(10) Patent No.: US 10,651,831 B2
(45) Date of Patent: May 12, 2020

(54) OSCILLATION CIRCUIT

(71) Applicant: ABLIC Inc., Chiba-shi, Chiba (JP)

(72) Inventor: Kotaro Watanabe, Chiba (JP)

(73) Assignee: ABLIC INC., Chiba (JP)

(*) Notice: Subject to any disclaimer, the term of this patent is extended or adjusted under 35 U.S.C. 154(b) by 0 days.

(21) Appl. No.: 16/250,479

(22) Filed: Jan. 17, 2019

(65) Prior Publication Data
US 2019/0280677 A1 Sep. 12, 2019

(30) Foreign Application Priority Data
Mar. 12, 2018 (JP) ................... 2018-043933

(51) Int. Cl.
*H03K 3/354* (2006.01)
*H03K 3/0231* (2006.01)
*H03K 3/03* (2006.01)
*H02M 3/07* (2006.01)
*G05F 3/26* (2006.01)
*G05F 1/567* (2006.01)
*H03B 5/24* (2006.01)

(52) U.S. Cl.
CPC .............. *H03K 3/354* (2013.01); *G05F 1/567* (2013.01); *G05F 3/262* (2013.01); *H02M 3/07* (2013.01); *H03B 5/24* (2013.01); *H03K 3/0231* (2013.01); *H03K 3/0315* (2013.01)

(58) Field of Classification Search
CPC .... H03K 3/354; H03K 3/0231; H03K 3/0315; H03K 3/02; H03B 5/24; H02M 3/07; G05F 3/262

USPC ................................................. 331/111, 143
See application file for complete search history.

(56) References Cited

U.S. PATENT DOCUMENTS

| | | | |
|---|---|---|---|
| 5,699,024 A * | 12/1997 | Manlove | H03K 3/0231 331/111 |
| 5,870,345 A | 2/1999 | Stecker | |
| 8,232,846 B1 * | 7/2012 | De Vita | H03K 4/502 331/111 |
| 8,643,442 B2 * | 2/2014 | Wang | H03K 3/02315 331/111 |

FOREIGN PATENT DOCUMENTS

JP H11-168358 A 6/1999

* cited by examiner

*Primary Examiner* — Arnold M Kinkead
(74) *Attorney, Agent, or Firm* — Brinks Gilson & Lione

(57) ABSTRACT

An oscillation circuit small in circuit scale and in the influence of temperature on its oscillation frequency is provided. The oscillation circuit includes: a constant current circuit configured to supply a current based on a first depletion MOS transistor; a charge/discharge circuit having a first capacitor, a second capacitor, a second depletion MOS transistor, and a third depletion MOS transistor provided in a current path for charging the second capacitor, the first to third depletion MOS transistors having the same threshold voltage and the same temperature characteristics of the threshold voltage; and an RS latch circuit configured to output a waveform that falls by input of the reset signal and rises by input of the set signal.

8 Claims, 6 Drawing Sheets

OSCILLATION CIRCUIT

RELATED APPLICATIONS

This application claims priority under 35 U.S.C. § 119 to Japanese Patent Application No. 2018-043933 filed on Mar. 12, 2018, the entire content of which is hereby incorporated by reference.

BACKGROUND OF THE INVENTION

1. Field of the Invention

The present invention relates to an oscillation circuit.

2. Description of the Related Art

A configuration like the one described in Japanese Patent Application Laid-open No. Hei 11-168358 is known as the configuration of an oscillation circuit of the related art. FIG. 6 is a diagram for illustrating an oscillation circuit 700 of the related art.

MOS transistors 702 and 704 form a current mirror circuit. A MOS transistor 706 uses a control voltage V1 to control a current I1 flowing in the current mirror circuit. A drain of the MOS transistor 704 is a node N6.

A resistor 708 is connected between a first power source VDD and the node N6, and allows a current I2 to flow. A capacitor 710 is connected between the node N6 and a second power source VSS (GND).

A voltage of the node N6 and a reference voltage VREF are input to a differential amplifier 712. An output of the differential amplifier 712 is connected to a pulse generator 716. The pulse generator 716 outputs a reset signal and an oscillation output signal OUT. A reset signal output of the pulse generator 716 is connected to a gate of a reset transistor 714. The oscillation output signal OUT is output to the outside.

The capacitor 710 is charged with a current I3 obtained by adding the current I1 and the current I2. The current I1 has a characteristic in that a rise in temperature increases the current. The current I2 has a characteristic in that a rise in temperature decreases the current. When the charging of the capacitor 710 progresses to a point at which the voltage of the node N6 reaches the reference voltage VREF, the differential amplifier 712 inverts the output to turn on the reset transistor 714 via the pulse generator 716. The turning on of the reset transistor 714 causes the capacitor 710 to discharge. When the voltage of the node N6 drops below the reference voltage VREF, the differential amplifier 712 again inverts the output to turn off the reset transistor 714 via the pulse generator 716. Upon inverting the output to turn off the reset transistor 714, the pulse generator 716 outputs the oscillation output signal OUT, and thereby operates as an oscillation circuit.

The current I3 is the sum of the currents I1 and I2 which have opposite temperature dependencies to each other, and thus the current I3 can be a current independent of temperature. This makes it possible to obtain an oscillation circuit having characteristics in that the oscillation frequency is independent of temperature.

However, the oscillation circuit 700 requires two current sources having opposite characteristics with respect to temperature, a comparator, and such a reference voltage VREF as the one in a band gap reference (BGR) circuit independent of temperature. That is, the circuit scale of the oscillation circuit 700 is large. Further, a fluctuation in the temperature characteristics of the resistor 708 due to production tolerance causes the oscillation frequency to fluctuate depending on temperature.

SUMMARY OF THE INVENTION

An object of the present invention is therefore to provide an oscillation circuit small in circuit scale and in the influence of temperature on its oscillation frequency.

An oscillation circuit according to one embodiment of the present invention includes: a constant current circuit including a first depletion MOS transistor and configured to supply a current based on the first depletion MOS transistor; a charge/discharge circuit including a first capacitor, a second capacitor, a second depletion MOS transistor, and a third depletion MOS transistor, the charge/discharge circuit being configured to charge the first capacitor with a current of the constant current circuit based on the first depletion MOS transistor and output a reset signal when the charging of the first capacitor is completed, and configured to charge the second capacitor with a current of the constant current circuit based on the first depletion MOS transistor and output a set signal when the charging of the second capacitor is completed, the second depletion MOS transistor being provided in a current path for charging the first capacitor, and having the same threshold voltage and the same temperature characteristics of the threshold voltage as a threshold voltage of the first depletion MOS transistor and temperature characteristics of the threshold voltage of the first depletion MOS transistor, the third depletion MOS transistor being provided in a current path for charging the second capacitor, and having the same threshold voltage and the same temperature characteristics of the threshold voltage as the threshold voltage of the first depletion MOS transistor and the temperature characteristics of the threshold voltage of the first depletion MOS transistor; and an RS latch circuit configured to output a waveform that falls by input of the reset signal, and rises by input of the set signal.

According to one embodiment of the present invention, an oscillation circuit smaller in circuit scale than conventional oscillation circuits can be obtained which is also small in the influence of temperature on its oscillation frequency because even when the current of the constant current circuit increases due to a temperature rise, the threshold voltage of the MOS transistors in the charge/discharge circuit rises.

DETAILED DESCRIPTION OF THE PREFERRED EMBODIMENTS

In the following, embodiments of the present invention are described with reference to the accompanying drawings.

First Embodiment

Figure 1:
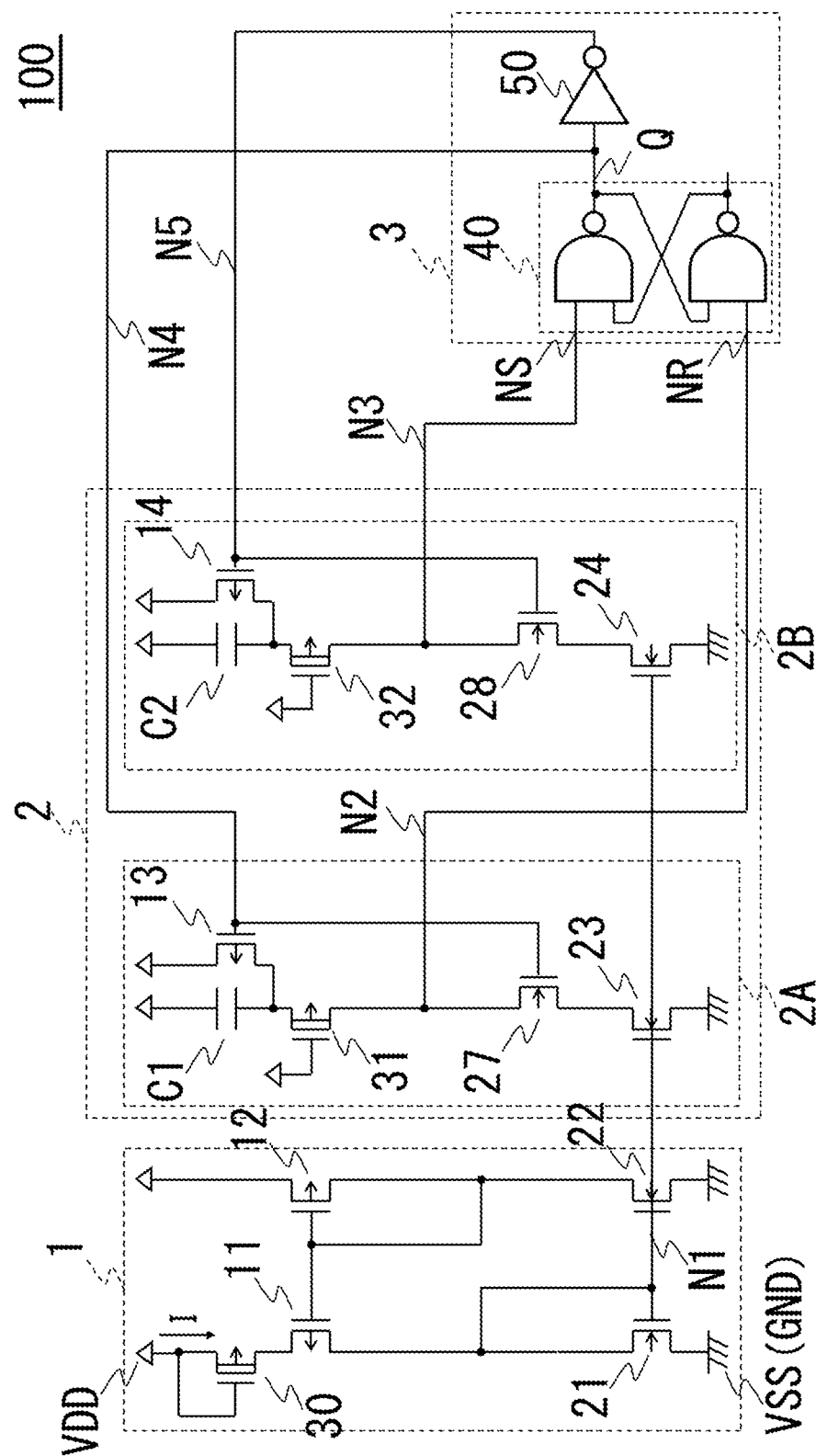
FIG. 1 is a diagram for illustrating an oscillation circuit according to a first embodiment of the present invention.

FIG. 1 is a diagram for illustrating an oscillation circuit 100 according to a first embodiment of the present invention. The oscillation circuit 100 includes a constant current circuit 1, a charge/discharge circuit 2, and a control circuit 3.

The constant current circuit 1 includes a depletion PMOS transistor 30 serving as a current source, enhancement PMOS transistors 11 and 12 which are constituents of a current mirror circuit, and enhancement NMOS transistors 21 and 22 which are similarly constituents of a current mirror circuit. The depletion PMOS transistor 30 has a source and a gate respectively connected to a first power source VDD, and a drain connected to a source of the PMOS transistor 11. The PMOS transistor 11 has a gate connected to a gate of the PMOS transistor 12, and a drain connected to a drain and a gate of the NMOS transistor 21. The drain of the PMOS transistor 11 is referred to as "node N1". The PMOS transistor 12 has a source connected to the first power source VDD, and a drain and the gate respectively connected to a drain of the NMOS transistor 22. The NMOS transistor 21 has a source connected to ground (GND) serving as a second power source VSS. The NMOS transistor 22 has a gate connected to the node N1, and a source connected to the second power source VSS.

The charge/discharge circuit 2 contains two charge/discharge circuits having the same configuration, e.g., a first charge/discharge circuit 2A and a second charge/discharge circuit 2B. The first charge/discharge circuit 2A includes a depletion PMOS transistor 31, an enhancement PMOS transistor 13, enhancement NMOS transistors 23 and 27, and a capacitor C1.

The capacitor C1 is connected at one end to the first power source VDD, and is connected at the other end to a source of the depletion PMOS transistor 31 and a drain of the PMOS transistor 13. That is, the depletion PMOS transistor 31 is provided in a current path for charging the capacitor C1. The depletion PMOS transistor 31 has a gate connected to the first power source VDD, and a drain connected to a drain of the NMOS transistor 27 and to an input NR of an RS latch circuit 40 via a node N2. The NMOS transistor 27 has a gate connected to a gate of the PMOS transistor 13 and to the output Q serving as one of the outputs, of the RS latch circuit 40 via a node N4, and has a source connected to a drain of the NMOS transistor 23. The NMOS transistor 23 has a gate connected to the node N1 of the constant current circuit 1, and a source connected to the second power source VSS. The NMOS transistor 23 and the NMOS transistor 21 form a current mirror circuit. A source of the PMOS transistor 13 is connected to the first power source VDD.

The second charge/discharge circuit 2B includes a depletion PMOS transistor 32, an enhancement PMOS transistor 14, enhancement NMOS transistors 24 and 28, and a capacitor C2.

The capacitor C2 is connected at one end to the first power source VDD, and is connected at the other end to a source of the depletion PMOS transistor 32 and a drain of the PMOS transistor 14. That is, the depletion PMOS transistor 32 is provided in a current path for charging the capacitor C2. The depletion PMOS transistor 32 has a gate connected to the first power source VDD, and a drain connected to a drain of the NMOS transistor 28 and to an input NS of the RS latch circuit 40 via a node N3. The NMOS transistor 28 has a gate connected to a gate of the PMOS transistor 14 and to an output of an inverter 50 via a node N5, and has a source connected to a drain of the NMOS transistor 24. The NMOS transistor 24 has a gate connected to the node N1 of the constant current circuit 1, and a source connected to the second power source VSS. The NMOS transistor 24 and the NMOS transistor 21 form a current mirror circuit. A source of the PMOS transistor 14 is connected to the first power source VDD.

The control circuit 3 includes the RS latch circuit 40 and the inverter 50.

In the RS latch circuit 40, the input NR serving as one of the inputs is connected to the first charge/discharge circuit 2A via the node N2 as described above, the input NS serving as the other input is connected to the second charge/discharge circuit 2B via the node N3 as described above, and the output Q serving as one of the outputs is connected to an input of the inverter 50 and to the gate of the PMOS transistor 13 via the node N4. The output of the inverter 50 is connected to the gate of the PMOS transistor 14 via the node N5.

The operation of the oscillation circuit 100 is described next.

The constant current circuit 1 supplies a current based on the depletion PMOS transistor 30 (to the charge/discharge circuit 2). In the constant current circuit 1, the NMOS transistors 21 and 22 form the current mirror circuit, and are set to the same value of W/L. The symbol W represents the channel width of a MOS transistor, and the symbol L represents the channel length of a MOS transistor. The PMOS transistors 11 and 12 similarly form the current mirror circuit, and the value of W/L of the PMOS transistor 11 is set larger than the value of W/L of the PMOS transistor 12 to adjust a source-drain voltage VDS of the depletion PMOS transistor 30 to a suitable value. MOS transistors having the same threshold voltage and the same temperature characteristics of the threshold voltage are used for the PMOS transistors 11 and 12, and MOS transistors having the same threshold voltage and the same temperature characteristics of the threshold voltage are used for the PMOS transistors 21 and 22 as well, to thereby make the source-drain voltage VDS of the depletion PMOS transistor 30 substantially independent of temperature, and accordingly constant. The magnitude of a current I flowing in the constant current circuit 1 therefore depends on the value of W/L of the depletion PMOS transistor 30, and temperature characteristics of the current I flowing in the constant current circuit 1 is determined depending on the temperature characteristics of the depletion PMOS transistor 30. The depletion PMOS transistor 30 is an example of a depletion transistor having characteristics in that the current I increases when the temperature rises while the source-drain voltage VDS is constant.

Figure 2:
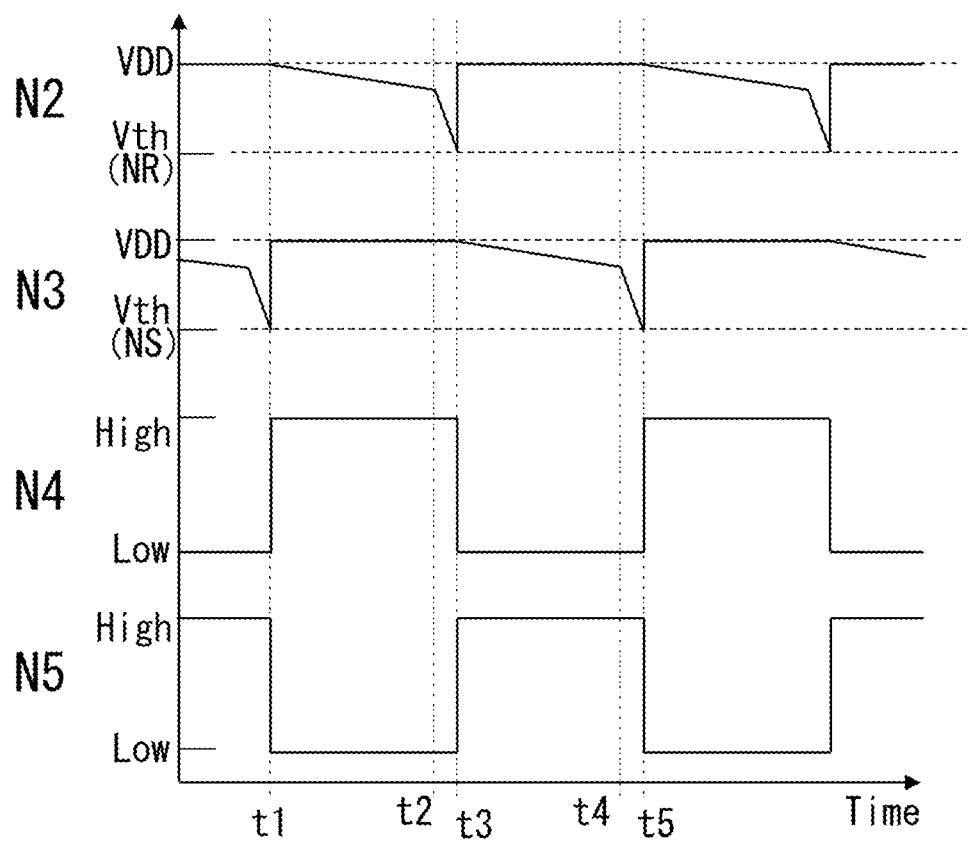
FIG. 2 is a timing chart for illustrating the operation of the oscillation circuit according to the first embodiment.

FIG. 2 is a timing chart of the nodes N2 to N5 in the first embodiment. The operation of the oscillation circuit 100 is described with reference to FIG. 2. In FIG. 2, the axis of abscissa indicates time, and the axis of ordinate indicates the voltages of the nodes N2 and N3 and logical levels of the nodes N4 and N5. The node N4 is at the low level and the node N5 is at the high level in an initial state. The second charge/discharge circuit 2B is in a charging operation state and, when the charging of the capacitor C2 progresses to a point at which the voltage of the node N3 is lowered by operation described later to a level below a threshold voltage Vth (NS) of the input NS which is a negative logical input of the RS latch circuit 40 the logical levels of the nodes N4 and N5 connected to the output Q of the RS latch circuit 40 are inverted. With the node N5 inverted to the low level, the PMOS transistor 14 is turned on and the NMOS transistor 28 is turned off in the second charge/discharge circuit 2B which sets the node N3 to the level of VDD and triggers a discharge state (at a time t1). If the drive performance of the PMOS transistor 14 is high enough, the NMOS transistor 28 may be removed to reduce the circuit area. On the other hand, the inversion of the node N4 to the high level turns off the PMOS transistor 13 and turns on the NMOS transistor 27 in the first charge/discharge circuit 2A, starts the charging of the capacitor C1, and thus switches a state of the first charge/discharge circuit 2A to a charging operation state. A charge current to the capacitor C1 is a current dependent on the depletion PMOS transistor 30 of the constant current circuit 1.

The first charge/discharge circuit 2A is in a charge operation state and, when a gate-source voltage of the depletion PMOS transistor 31 provided in a charging path of the capacitor C1 exceeds the absolute value of the threshold voltage of the depletion PMOS transistor 31, the depletion PMOS transistor is turned off (at a time t2).

The turning off of the depletion PMOS transistor 31 in the first charge/discharge circuit 2A causes the voltage of the node N2 to rapidly change to the VSS side. When the voltage of the node N2 in the first charge/discharge circuit 2A drops below a threshold voltage Vth (NR) of the input NR which is another negative logical input of the RS latch circuit 40 of the control circuit 3 the dropped voltage of the node N2 is input as a reset signal to the input NR of the RS latch circuit 40, and the logical levels of the nodes N4 and N5 connected to the output Q of the RS latch circuit 40 are inverted. That is, the RS latch circuit 40 outputs a waveform that falls by receiving the reset signal. With the node N4 inverted to the low level, the PMOS transistor 13 is turned on and the NMOS transistor 27 is turned off in the first charge/discharge circuit 2A which sets the node N2 to the level of VDD and triggers a discharge state (at a time t3).

The inversion of the node N5 to the high level turns off the PMOS transistor 14 and turns on the NMOS transistor 28 in the second charge/discharge circuit 2B, starts the charging of the capacitor C2, and thus switches a state of the first charge/discharge circuit 2A to a charge operation state.

At the time t3, the first charge/discharge circuit 2A is in a discharge state and the second charge/discharge circuit 2B is in the charge operation state. That is, the first charge/discharge circuit 2A is the same state as in the initial state. At a time t5, the voltage of the node N3 is input as a set signal to the input NS which is one of the negative logical inputs of the RS latch circuit 40, the logical level of the node N4 connected to the output Q of the RS latch circuit 40 changes to the high level, and the logical level of the node N5 connected to the output of the inverter 50 changes to the low level in the control circuit 3. That is, the RS latch circuit 40 outputs a waveform that rises by receiving the set signal. The same operation is subsequently repeated as oscillation operation performed by the oscillation circuit 100. A time period from t2 to t3 is illustrated as a long period as a way of emphasis for the purpose of description, but is actually an adequately short time in comparison to a time period from t1 to t2. A time period from t4 to t5 is also actually an adequately short time in comparison to a time period from t1 to t2.

The current I of the constant current circuit 1 has characteristics based on electrical characteristics of the depletion PMOS transistor 30 in that the current I increases as the temperature rises. The depletion PMOS transistors 31 and 32 have characteristics in that the threshold voltages of the depletion PMOS transistors 31 and 32 increase as the temperature rises. In a time period from the start of the charging of the capacitor C1 or C2 to the turning off of the depletion PMOS transistor 31 or 32, the depletion PMOS transistor 30 and the depletion PMOS transistor 31 or 32 share the same threshold voltage and the same temperature characteristics of the threshold voltage. This means that, while a rise in temperature increases the charge current based on the electrical characteristics of the depletion PMOS transistor 30 and flowing to the capacitor C1 or C2, the threshold voltage of the depletion PMOS transistor 31 or 32 rises as well, and the time period is accordingly constant instead of being dependent on temperature. According to the first embodiment, the oscillation circuit 100 smaller in circuit scale than conventional oscillation circuit and having an oscillation frequency independent of temperature can thus be obtained.

Details of the operation of the oscillation circuit 100 are described below with the use of mathematical expressions, by dividing the description into a case in which the depletion PMOS transistor 30 operates in a saturation range and a case in which the depletion PMOS transistor 30 operates in a non-saturation range.

A time period T from the start of the charging of the capacitor C1 to the turning off of the depletion PMOS transistor 31 in the first charge/discharge circuit 2A is expressed by the following expression:

$$T = \frac{C \times VTPD}{I'} \tag{1}$$

In Expression 1, the symbol C represents the capacitance value of the capacitor C1, VTPD represents the threshold voltage of the depletion PMOS transistor 31, and I' represents a charge current based on the depletion PMOS transistor 30 and flowing to the capacitor C1. The time period T in the second charge/discharge circuit 2B is expressed by the same expression as that of the first charge/discharge circuit 2A. The depletion PMOS transistor 31 and the depletion PMOS transistors 30 and 32 have the same threshold voltage VTPD as described above.

The charge current flowing to the capacitor C1 exhibited when the depletion PMOS transistor 30 operates in the saturation range is expressed by the following expression with the use of the threshold voltage VTPD of the depletion PMOS transistor 30.

$$I' \propto VTPD^2 \tag{2}$$

From Expression 1 and Expression 2, the time period T is expressed by the following expression:

$$T \propto \frac{C}{VTPD} \tag{3}$$

As indicated by Expression 1, the time period T is in proportion to the threshold voltage VTPD of the depletion PMOS transistor 31. The charge current is, as indicated by Expression 2, in proportion to a quadratic expression of the threshold voltage VTPD of the depletion PMOS transistor 30. As indicated by Expression 3, the threshold voltage VTPD of the depletion PMOS transistor 30 in the denominator and the threshold voltage VTPD of the depletion PMOS transistor 31 in the numerator are eliminated, and the time period T3 can be expressed by a simple expression having the threshold voltage VTPD in the denominator.

The capacitance value C is constant instead of being dependent on temperature. While the threshold voltage VTPD of the depletion PMOS transistors 30 and 31 varies depending on temperature, the influence of temperature on the time period T is canceled out by the threshold voltage VTPD of the depletion PMOS transistors 30 and 31 and is accordingly reduced. However, the influence of temperature on the time period T is still dependent on temperature-caused changes in the threshold voltage VTPD of the depletion PMOS transistors 30 and 31 in the denominator of Expression 3.

An appropriate adjustment of the value of W/L of the PMOS transistors 11 and 12 which form a current mirror circuit enables the depletion PMOS transistor 30 to operate in the non-saturation range. The current I' flowing when the depletion PMOS transistor 30 operates in the non-saturation range is expressed by the following expression:

$$I' \propto VTPD \times VDS - \tfrac{1}{2} \times VDS^2 \qquad (4)$$

In Expression 4, the symbol VDS represents the source-drain voltage of the depletion PMOS transistor 30. The source-drain voltage VDS of the depletion PMOS transistor 30 operating in the non-saturation range takes a value small enough to omit a term of a quadratic expression about the source-drain voltage VDS of the depletion PMOS transistor 30, and Expression 4 can accordingly be transformed into Expression 5.

$$I' \propto VTPD \times VDS \qquad (5)$$

From Expression 1 and Expression 5, the time period T is expressed by the following expression:

$$T \propto \frac{C}{VDS} \qquad (6)$$

The source-drain voltage VDS of the depletion PMOS transistor 30 is constant instead of being dependent on temperature, and the time period T is therefore a value independent of temperature. In the second charge/discharge circuit 2B, a time period from the start of the charging of the capacitor C2 to the turning off of the depletion PMOS transistor 32 is expressed by the same expression as that of the first charge/discharge circuit 2A. In this manner, the oscillation circuit 100 having an oscillation frequency independent of temperature can be obtained by allowing the depletion PMOS transistor 30 to operate in the non-saturation range.

Second Embodiment

Figure 3:
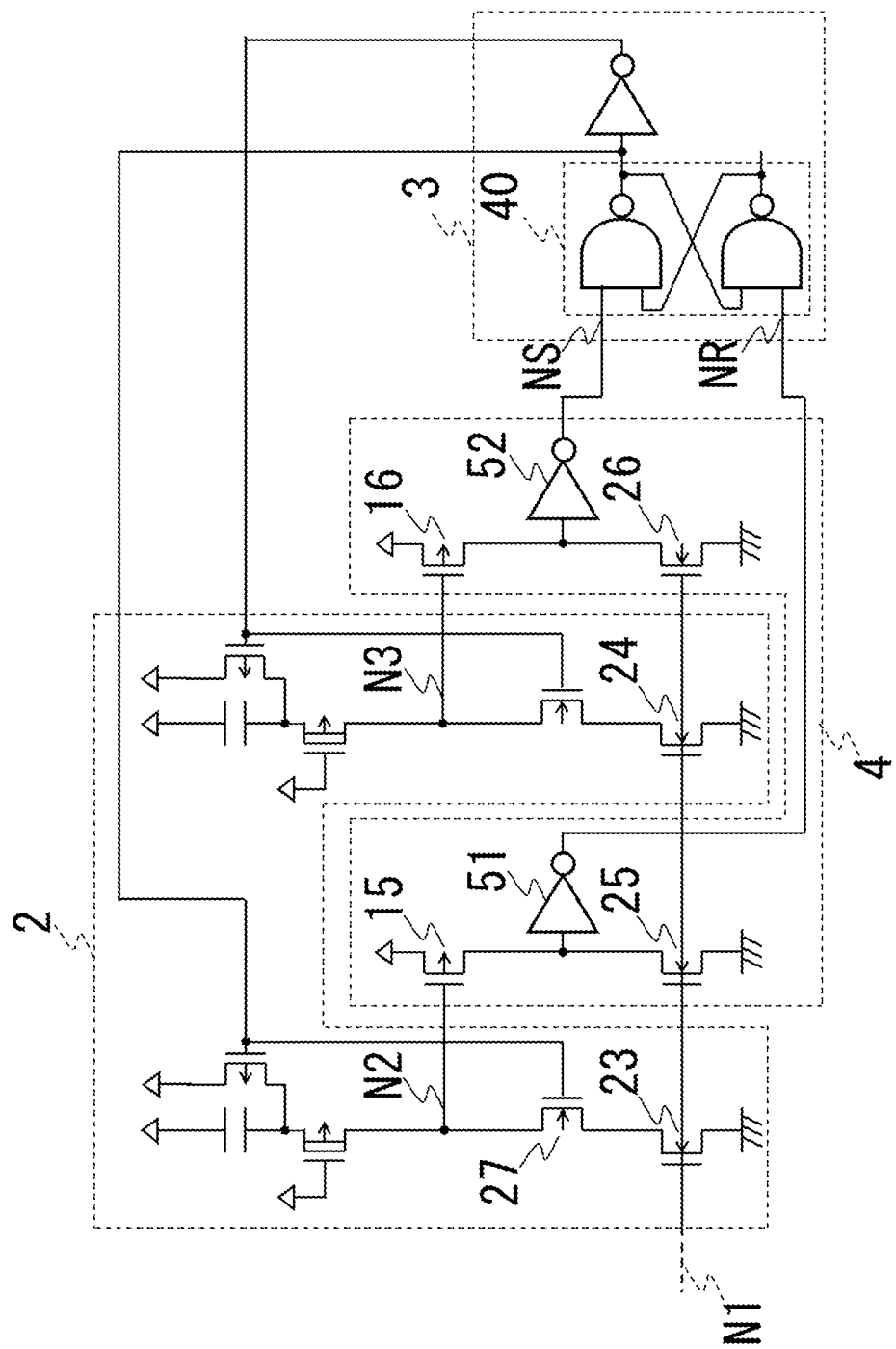
FIG. 3 is a diagram for illustrating an oscillation circuit according to a second embodiment of the present invention.

FIG. 3 is a diagram for illustrating the charge/discharge circuit 2, the control circuit 3, and a waveform shaping circuit 4 in an oscillation circuit according to a second embodiment of the present invention. The second embodiment differs from the first embodiment in that the waveform shaping circuit 4 is included in the first embodiment, and the rest is the same as the first embodiment. Descriptions on the same parts as those in the first embodiment are omitted.

The waveform shaping circuit 4 includes enhancement PMOS transistors 15 and 16, enhancement NMOS transistors 25 and 26, and inverters 51 and 52.

The PMOS transistor 15 has a source connected to the first power source VDD, a gate connected to the node N2, and a drain connected to the NMOS transistor 25 and to an input of the inverter 51. The NMOS transistor 25 has a gate connected to the node N1 of the constant current circuit, and a source connected to the second power source VSS. The NMOS transistor 25, together with the NMOS transistor 21 (illustrated in FIG. 1), form a current mirror circuit. An output of the inverter 51 is connected to the input NR serving as one of the inputs of the RS latch circuit 40 in the control circuit 3. The PMOS transistor 16 has a source connected to the first power source VDD, a gate connected to the node N3, and a drain connected to the NMOS transistor 26 and to an input of the inverter 52. The NMOS transistor 26 has a gate connected to the node N1 of the constant current circuit, and a source connected to the second power source VSS. The NMOS transistor 26, together with the NMOS transistor 21 (illustrated in FIG. 1), form a current mirror circuit. An output of the inverter 52 is connected to the input NS serving as the other one of the inputs of the RS latch circuit 40 in the control circuit 3.

The waveform shaping circuit 4 operates so that a reset signal and set signal output from the charge/discharge circuit 2 change rapidly. A description on the operation principle of the waveform shaping circuit 4 is omitted.

In the oscillation circuit according to the second embodiment, with the inclusion of the waveform shaping circuit 4 located between the charge/discharge circuit 2 and the control circuit 3, the waveform input to the RS latch circuit 40 of the control circuit 3 is made sharper than in the oscillation circuit 100. The oscillation circuit according to the second embodiment is capable of reducing a through-current at the time of a signal change, and consequently consumes less power. The waveform shaping circuit is not limited to the configuration illustrated in FIG. 3, and may take other forms.

Third Embodiment

Figure 4:
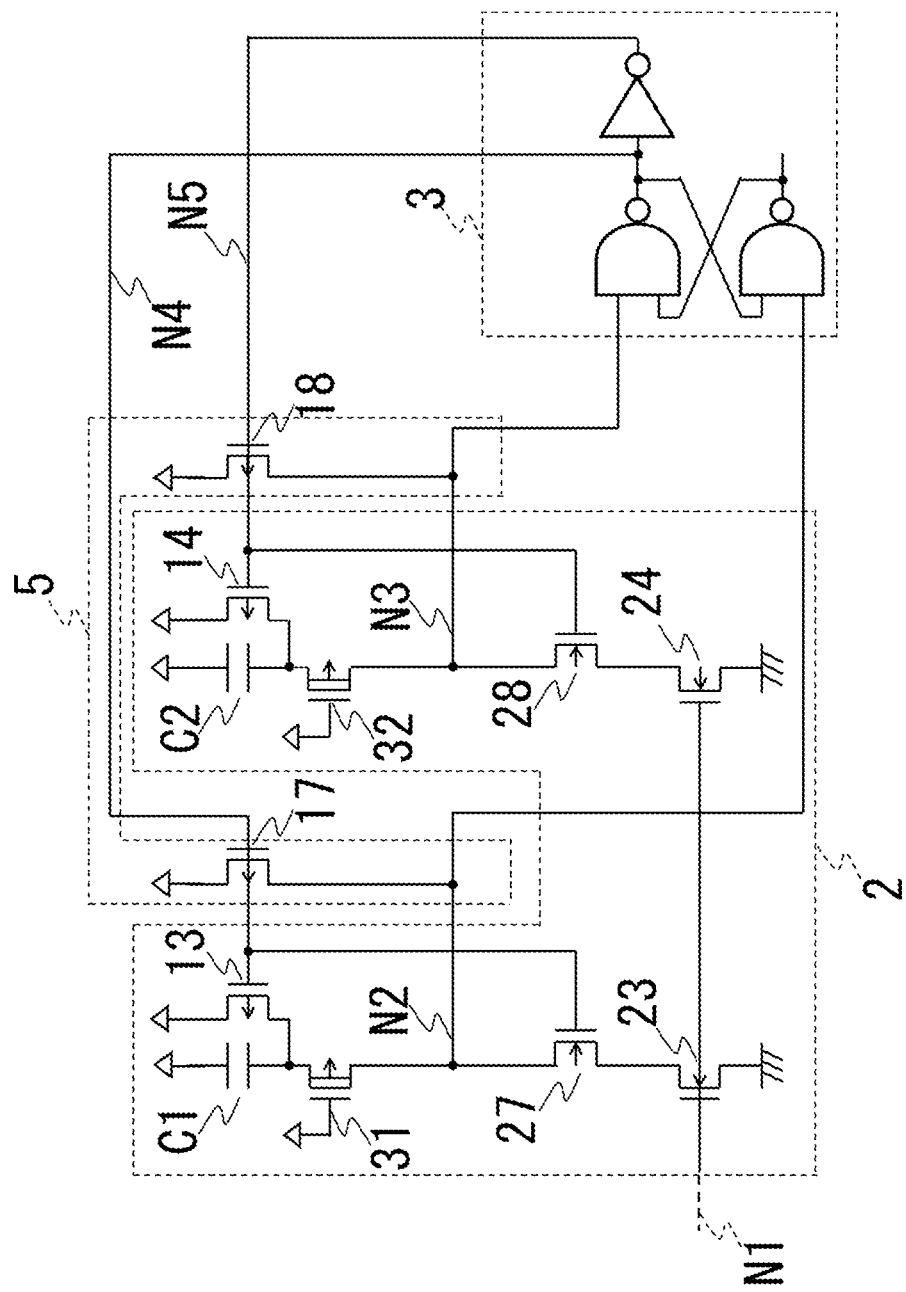
FIG. 4 is a diagram for illustrating an oscillation circuit according to a third embodiment of the present invention.

FIG. 4 is a diagram for illustrating the charge/discharge circuit 2, the control circuit 3, and a voltage boost circuit 5 in an oscillation circuit according to a third embodiment of the present invention. The third embodiment differs from the first embodiment in that the voltage boost circuit 5 is included in the oscillation circuit 100, and the rest is the same as the first embodiment. Descriptions on the same parts as those in the first embodiment are omitted.

The voltage boost circuit 5 includes enhancement PMOS transistors 17 and 18.

The PMOS transistor 17 has a source connected to the first power source VDD, a gate connected to the node N4, and a drain connected to the node N2. The PMOS transistor 18 has a source connected to the first power source VDD, a gate connected to the node N5, and a drain connected to the node N3.

The operation in the third embodiment is described. In the time period from the time t1 to the time t3 in FIG. 2 which is a timing chart for illustrating the operation in the first embodiment, the voltage of the node N3 in the second charge/discharge circuit 2B (illustrated in FIG. 1) is illustrated as the level of VDD. Strictly speaking, the voltage of the node N3 in the time period is slightly lower than VDD due to a voltage drop of the depletion PMOS transistor 32. The amount of voltage drop of the depletion PMOS transistor 32 depends on temperature, thereby making the voltage of the node N3 dependent on temperature when the charging is started at the time t3. According to the third embodiment, an oscillation circuit having an oscillation frequency independent of temperature can be obtained by turning on the PMOS transistor 18 at the same time the PMOS transistor 14 is turned on, and thus the voltage of the node N3 is raised directly to the level of VDD. The depletion PMOS transistor 31 and the node N2 operate in the same way as the depletion PMOS transistor 32 and the node N3, and a description on the operation is therefore omitted.

Fourth Embodiment

Figure 5:
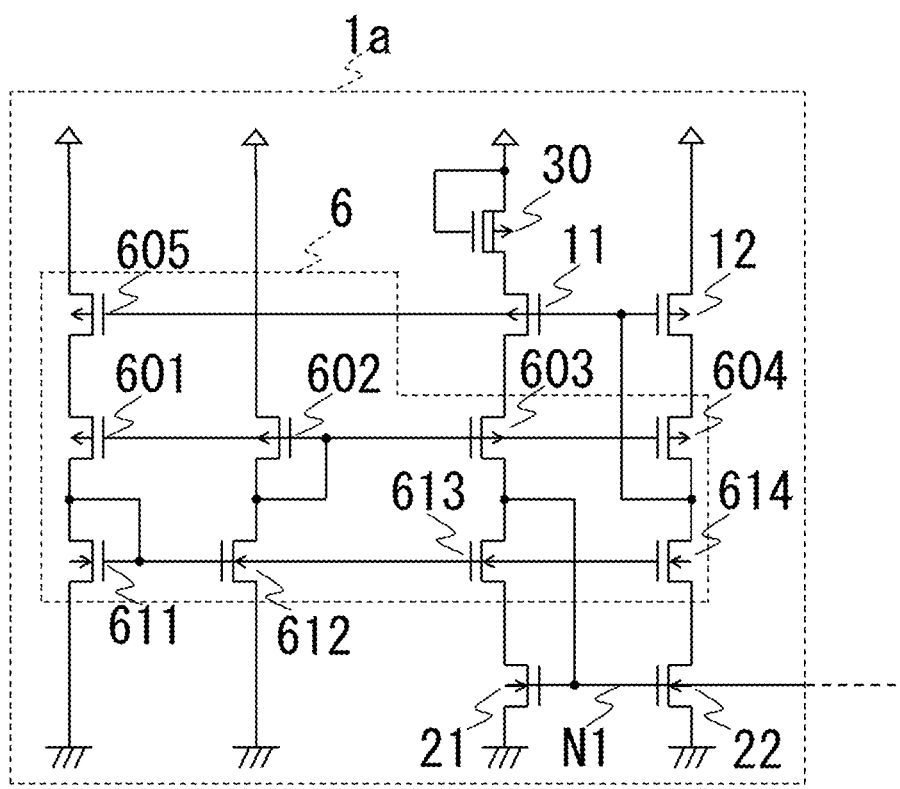
FIG. 5 is a diagram for illustrating an oscillation circuit according to a fourth embodiment of the present invention.
Figure 6:
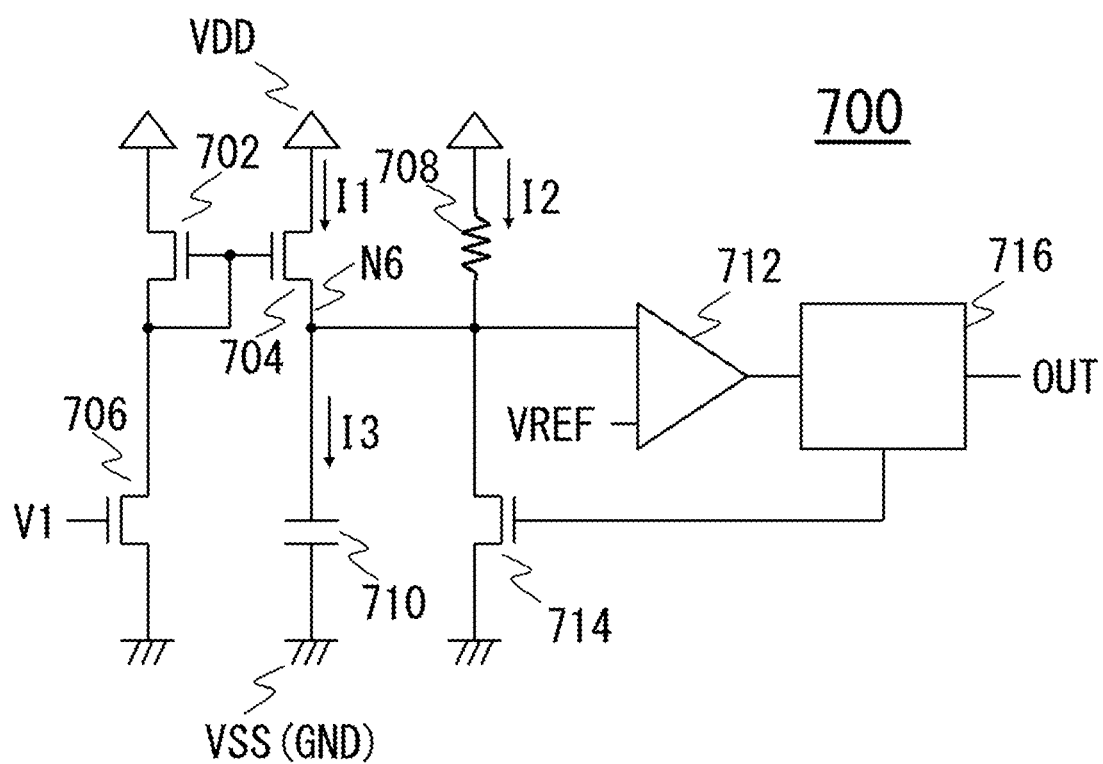
FIG. 6 is a diagram for illustrating an oscillation circuit of the related art.

FIG. 5 is a diagram for illustrating a constant current circuit 1a in an oscillation circuit according to a fourth embodiment of the present invention. The constant current circuit 1a illustrated in the fourth embodiment is obtained by incorporating a cascode circuit 6 into the constant current circuit 1 illustrated in the first embodiment. Specifically, the constant current circuit 1a in the oscillation circuit according to the fourth embodiment includes the cascode circuit 6 between the PMOS transistor 11 and the NMOS transistor 21 and between the PMOS transistor 12 and the NMOS transistor 22, and thus have a cascode current mirror circuit configuration. The cascode circuit 6 includes enhancement PMOS transistors 601 to 605 and enhancement NMOS transistors 611 to 614.

The PMOS transistor 605 has a source connected to the first power source VDD, and a gate connected to the gates of the PMOS transistors 11 and 12, to a drain of the PMOS transistor 604, and to a drain of the NMOS transistor 614. A drain of the PMOS transistor 605 is connected to a source of the PMOS transistor 601. A gate of the PMOS transistor 601 is connected to a drain of the PMOS transistor 602 and to a drain of the NMOS transistor 612. A drain of the PMOS transistor 601 is connected to a drain and a gate of the NMOS transistor 611. A source of the PMOS transistor 602 is connected to the first power source VDD. The PMOS transistor 603 has a source connected to the drain of the PMOS transistor 11, and a drain connected to a drain of the NMOS transistor 613 and to the gates of the NMOS transistors 21 and 22. A source of the PMOS transistor 604 is connected to the drain of the PMOS transistor 12. The NMOS transistor 611 has a source connected to the second power source VSS, and the gate connected to gates of the NMOS transistors 612 to 614. A source of the NMOS transistor 612 is connected to the second power source VSS. A source of the NMOS transistor 613 is connected to the drain of the NMOS transistor 21. A source of the NMOS transistor 614 is connected to the drain of the NMOS transistor 22. The cascode circuit 6 has a general configuration for cascode circuits, and a description on the operation of the cascode circuit 6 is therefore omitted.

In the constant current circuit 1 in the first embodiment, a fluctuation of the first power source VDD slightly changes the current value of the output constant current due to a voltage fluctuation. The constant current circuit 1a which includes the cascode circuit 6, can improve changes in oscillation frequency brought about by fluctuations of the first power source VDD.

The first embodiment to the fourth embodiment may be carried out in combination. The configurations of the oscillation circuits according to the first embodiment to the fourth embodiment are given as an example, and can be modified without departing from the scope of the appended claims.

Though not shown, examples of modification to the configuration of the oscillation circuit according to the present invention may include adding an enable switch as required in order to reduce the consumed current when the circuit function is not in use, or adding an activation circuit for stable operation of the constant current circuit 1. In another example of the modification, one or both of a first group of a plurality of depletion PMOS transistors that have the same depletion type and the same value of W/L as those of the depletion PMOS transistor 30 and a second group of a plurality of depletion PMOS transistors that have the same depletion type as and a different value of W/L from those of the depletion PMOS transistor 30 may be connected in parallel to the depletion PMOS transistor 30, so that a combination canceling out fluctuations of the depletion PMOS transistor 30 can be selected in anticipation for a case in which fluctuations of the depletion PMOS transistor 30 due to production tolerance causes the value of the current I of the constant current circuit 1 to fluctuate. In this example, one or both of the first and second groups may be connected in place of the depletion PMOS transistor 30, so that the combination canceling out fluctuations of the depletion PMOS transistor 30 can be also selected. Similarly, capacitors having different capacitance values may be arranged in parallel to the capacitors C1 and C2 so that a combination canceling out fluctuations of the capacitance values of C1 and C2 can be selected in anticipation for a case in which the capacitance values of the capacitors C1 and C2 fluctuate due to production tolerance.

What is claimed is:

1. An oscillation circuit comprising:
   a constant current circuit including a first depletion MOS transistor and configured to supply a current based on the first depletion MOS transistor;
   a charge/discharge circuit including:
      a first capacitor;
      a second capacitor;
      a second depletion MOS transistor; and
      a third depletion MOS transistor,
      the charge/discharge circuit being configured to charge the first capacitor with a current based on the first depletion MOS transistor and output a reset signal when the charging of the first capacitor is completed, and configured to charge the second capacitor with a current based on the first depletion MOS transistor and output a set signal when the charging of the second capacitor is completed,
      the second depletion MOS transistor being provided in a current path for charging the first capacitor, and having the same threshold voltage and the same temperature characteristics of the threshold voltage as a threshold voltage of the first depletion MOS transistor and temperature characteristics of the threshold voltage of the first depletion MOS transistor,
      the third depletion MOS transistor being provided in a current path for charging the second capacitor, and having the same threshold voltage and the same temperature characteristics of the threshold voltage as the threshold voltage of the first depletion MOS transistor and the temperature characteristics of the threshold voltage of the first depletion MOS transistor; and
   an RS latch circuit configured to output a waveform that falls by input of the reset signal, and rises by input of the set signal.

2. The oscillation circuit according to claim 1, further comprising:
   a first waveform shaping circuit provided between an output of the charge/discharge circuit from which the reset signal is to be output and an input of the RS latch circuit to which the reset signal is to be input; and
   a second waveform shaping circuit provided between an output of the charge/discharge circuit from which the set signal is to be output and an input of the RS latch circuit to which the set signal is to be input.

3. The oscillation circuit according to claim 1, wherein the charge/discharge circuit further includes a voltage boost circuit.

4. The oscillation circuit according to claim 2, wherein the charge/discharge circuit further includes a voltage boost circuit.

5. The oscillation circuit according to claim 1, wherein the constant current circuit further includes a cascode circuit.

6. The oscillation circuit according to claim 2, wherein the constant current circuit further includes a cascode circuit.

7. The oscillation circuit according to claim 3, wherein the constant current circuit further includes a cascode circuit.

8. The oscillation circuit according to claim 4, wherein the constant current circuit further includes a cascode circuit.

* * * * *